(12) United States Patent
Makino et al.

(10) Patent No.: US 10,559,736 B2
(45) Date of Patent: Feb. 11, 2020

(54) THERMOELECTRIC GENERATOR

(71) Applicant: KELK Ltd., Hiratsuka-shi, Kanagawa (JP)

(72) Inventors: Kazuya Makino, Hiratsuka (JP);
Haruo Imamura, Hiratsuka (JP);
Hirokuni Hachiuma, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 15/322,521

(22) PCT Filed: Jun. 29, 2015

(86) PCT No.: PCT/JP2015/068653
§ 371 (c)(1),
(2) Date: Dec. 28, 2016

(87) PCT Pub. No.: WO2016/002706
PCT Pub. Date: Jan. 7, 2016

(65) Prior Publication Data
US 2017/0141281 A1 May 18, 2017

(30) Foreign Application Priority Data

Jul. 2, 2014 (JP) ................................. 2014-137058

(51) Int. Cl.
| H01L 35/30 | (2006.01) |
| H01L 35/10 | (2006.01) |
| H01L 35/32 | (2006.01) |

(52) U.S. Cl.
CPC .............. *H01L 35/10* (2013.01); *H01L 35/30* (2013.01); *H01L 35/32* (2013.01)

(58) Field of Classification Search
CPC .......... H01L 35/10; H01L 35/30; H01L 35/32
(Continued)

(56) References Cited

U.S. PATENT DOCUMENTS

| 6,084,172 A * | 7/2000 | Kishi ...................... H01L 35/32 136/200 |
| 2002/0062649 A1 * | 5/2002 | Ohkubo ................... H01L 35/00 62/3.7 |

(Continued)

FOREIGN PATENT DOCUMENTS

| CN | 1612371 | 5/2005 |
| CN | 104067387 | 9/2014 |

(Continued)

OTHER PUBLICATIONS

International Preliminary Report on Patentability in International Application No. PCT/JP2015/068653, dated Jan. 3, 2017, 7 pages, with English translation.

(Continued)

*Primary Examiner* — Thanh Truc Trinh
(74) *Attorney, Agent, or Firm* — Fish & Richardson P.C.

(57) ABSTRACT

A thermoelectric generator includes: a heat-receiving plate configured to receive heat; a cooling plate configured to be kept at a lower temperature than a temperature of the heat-receiving plate; and a thermoelectric generation module interposed between the heat-receiving plate and the cooling plate, in which the thermoelectric generation module includes: an opposed surface that is opposed to the cooling plate; a plurality of thermoelectric elements; a terminal configured to electrically conduct to the thermoelectric elements; and a lead member bonded to the terminal, in which the lead member penetrates the opposed surface and extends to the cooling plate.

19 Claims, 6 Drawing Sheets

(58) Field of Classification Search
USPC .................................. 136/200–242
See application file for complete search history.

(56) References Cited

U.S. PATENT DOCUMENTS

| | | | |
|---|---|---|---|
| 2005/0241690 A1* | 11/2005 | Tajima | H01L 35/08 |
| | | | 136/212 |
| 2009/0188542 A1 | 7/2009 | Tajima et al. | |
| 2013/0098068 A1 | 4/2013 | Takahashi et al. | |
| 2014/0216516 A1 | 8/2014 | Makino et al. | |
| 2015/0021750 A1 | 1/2015 | Fujino et al. | |

FOREIGN PATENT DOCUMENTS

| | | |
|---|---|---|
| JP | H06-207762 | 7/1994 |
| JP | H10-41663 | 2/1998 |
| JP | 2011-238693 | 11/2011 |
| JP | 2013-080883 | 5/2013 |
| JP | 2013-102135 | 5/2013 |
| JP | 5642419 | 12/2014 |

OTHER PUBLICATIONS

Chinese Office Action in Chinese Application No. 201580035213.0 dated Jan. 26, 2018, 12 pages (with English Translation).
International Search Report and Written Opinion in International Application No. PCT/JP2015/068653, dated Sep. 29, 2015, 13 pages, with English translation.

* cited by examiner

THERMOELECTRIC GENERATOR

CROSS-REFERENCE TO RELATED APPLICATIONS

This application claims priority to International Application No. PCT/JP2015/068653 filed on Jun. 29, 2015, which claims priority to Japanese Patent Application No. 2014-137058 filed Jul. 2, 2014, the contents of which are incorporated herein in their entirety.

TECHNICAL FIELD

The present invention relates to a thermoelectric generator, more specifically, relates to an improvement in an electricity extraction structure from a thermoelectric generation module inside the thermoelectric generator.

BACKGROUND ART

There has been typically known a thermoelectric generator including a heat-receiving plate, a cooling plate, and a plurality of thermoelectric generation modules interposed between the heat-receiving plate and the cooling plate (see, for instance, Patent Literature 1). In the thermoelectric generator of Patent Literature 1, a lead wire connected to the thermoelectric generation modules and configured to extract electricity from the thermoelectric generation modules passes through a space between the heat-receiving plate and the cooling plate and is drawn out of a top surface of the cooling plate via a through hole provided in the cooling plate.

CITATION LIST

Patent Literature(s)

Patent Literature 1: JP-A-2013-080883

SUMMARY OF THE INVENTION

Problem(s) to be Solved by the Invention

In the thermoelectric generator of Patent Literature 1, the lead wire passing through the space between the heat-receiving plate and the cooling plate possibly contacts with the heat-receiving plate heated to a high temperature, which causes a coating of the lead wire to exceed the limit of a heat resistance to be damaged, resulting in dielectric breakdown.

An object of the invention is to provide a thermoelectric generator capable of reliably preventing deterioration and/or damage of a lead member because of heat.

Means for Solving the Problem(s)

According to an aspect of the invention, a thermoelectric generator includes: a heat-receiving plate configured to receive heat; a cooling plate configured to be kept at a lower temperature than a temperature of the heat-receiving plate; and a thermoelectric generation module interposed between the heat-receiving plate and the cooling plate, in which the thermoelectric generation module includes: an opposed surface that is opposed to the cooling plate; a plurality of thermoelectric elements; a terminal configured to electrically conduct to the thermoelectric elements; and a lead member bonded to the terminal, and the lead member penetrates the opposed surface and extends to the cooling plate.

In the above arrangement, it is preferable that the thermoelectric generation module includes a first thin sheet covering an entire side of the plurality of thermoelectric elements opposed to the cooling plate and forming the opposed surface, the terminal is formed on a surface of the first thin sheet opposed to the thermoelectric elements, and the lead member penetrates the first thin sheet and is soldered to the terminal.

In the above arrangement, it is preferable that the terminal is bonded to a support member that supports the terminal.

In the above arrangement, it is preferable that the support member includes a plurality of support members and the plurality of support members are disposed surrounding a bonding portion of the terminal to the lead member, and the support member has the same outline as the thermoelectric element.

In the above arrangement, it is preferable that the thermoelectric generation module includes a second thin sheet covering an entire side of the plurality of thermoelectric elements opposed to the heat-receiving plate, a support terminal is formed opposed to the terminal on a surface of the second thin sheet opposed to the thermoelectric elements, and the support member is bonded between the terminal and the support terminal.

In the above arrangement, it is preferable that the terminal comprises an element connection portion connected to the thermoelectric elements, and the support terminal has a portion having substantially the same shape as the element connection portion in a plan view.

In the above arrangement, it is preferable that the terminal includes: an element connection portion having a predetermined length and connected to the thermoelectric elements; and a lead connection portion having a predetermined length and connected to the lead member, in which the element connection portion and the lead connection portion form substantially an L-shape in a plan view such that a length direction of the element connection portion is orthogonal to a length direction of the lead connection portion In the above arrangement, it is preferable that a length of the lead connection portion of the terminal is twice or more as long as a width in a width direction of the element connection portion in parallel to a length direction of the lead connection portion.

In the above arrangement, it is preferable that the lead member and the terminal are provided at each of ends of an anode and a cathode in an electric circuit of the plurality of thermoelectric elements connected in series, and the terminals at the respective ends are axisymmetric to each other in a plan view.

In the above arrangement, it is preferable that the lead member is drawn out to an outside through a through hole provided on the cooling plate.

In the above arrangement, it is preferable that an insulation film is formed on an inner surface of the through hole.

In the above arrangement, it is preferable that an insulation material is fed between the through hole and the lead member.

In the above arrangement, it is preferable that the lead member is made of metal and shaped in a column and the lead member includes a lead wire covered with an insulation material.

According to the above aspect of the invention, since the lead member bonded to the terminal of the thermoelectric generation module penetrates the opposed surface, which is opposed to the cooling plate, from the terminal to the cooling plate, the lead member is not drawn out between the heat-receiving plate and the cooling plate unlike a conventional arrangement. Accordingly, the lead member is neither deteriorated nor damaged, for instance, by contacting with the heat-receiving plate heated to a high temperature. For instance, when the lead member is provided in a form of a lead wire (e.g., a cable in a form of a conductive body covered with an insulative coating), there is no fear that the insulative coating is damaged by heat from the heat-receiving plate, thereby reliably preventing occurrence of dielectric breakdown between the lead wire and the heat-receiving plate, so that an insulation performance is improvable.

BRIEF DESCRIPTION OF DRAWING(S)

DESCRIPTION OF EMBODIMENT(S)

Overall Description of Thermoelectric Generator

Exemplary embodiment(s) of the invention will be described below with reference to the attached drawings.

Figure 1:
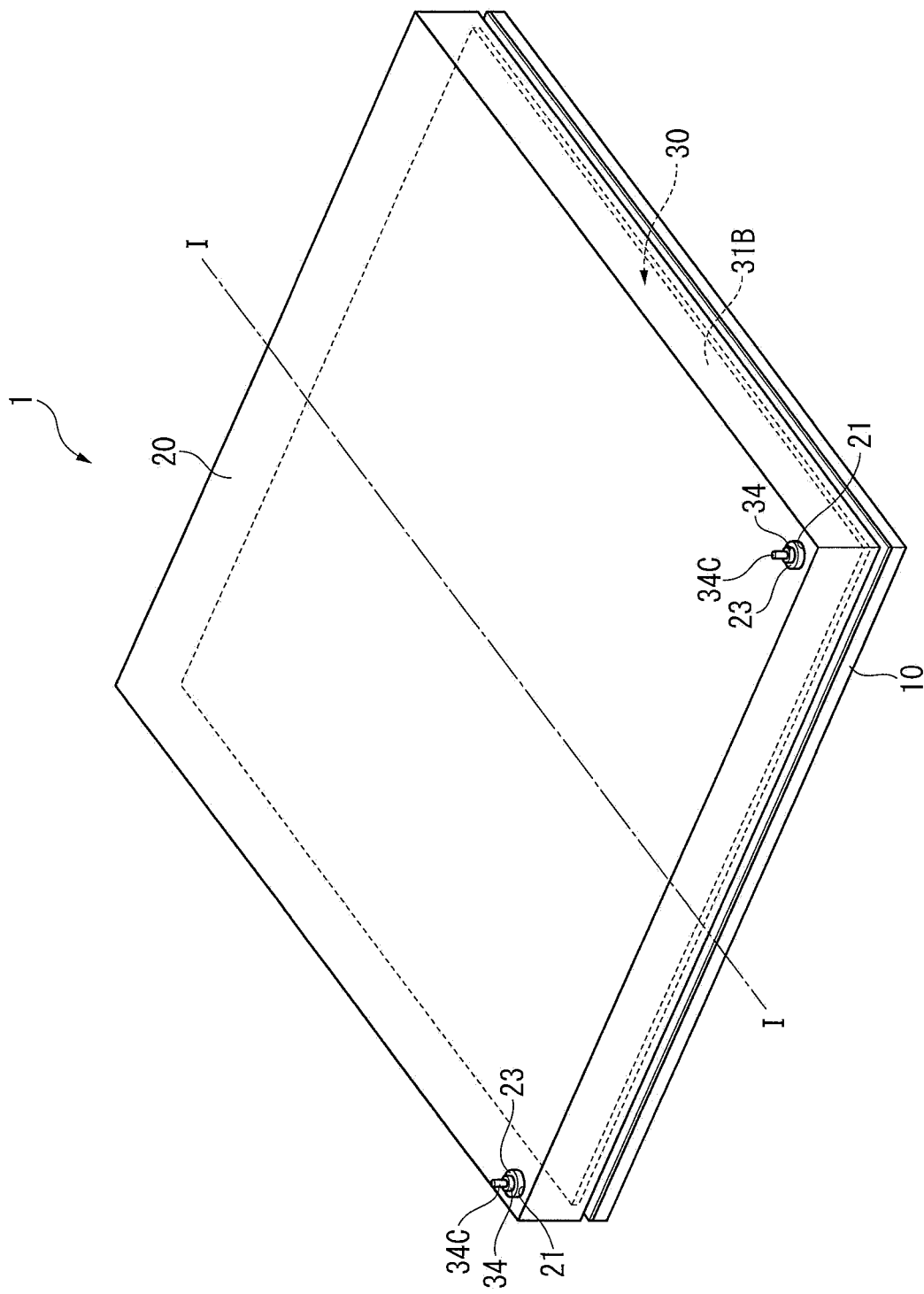
FIG. 1 is a perspective view of an entire thermoelectric generator according to an exemplary embodiment of the invention.
Figure 2:
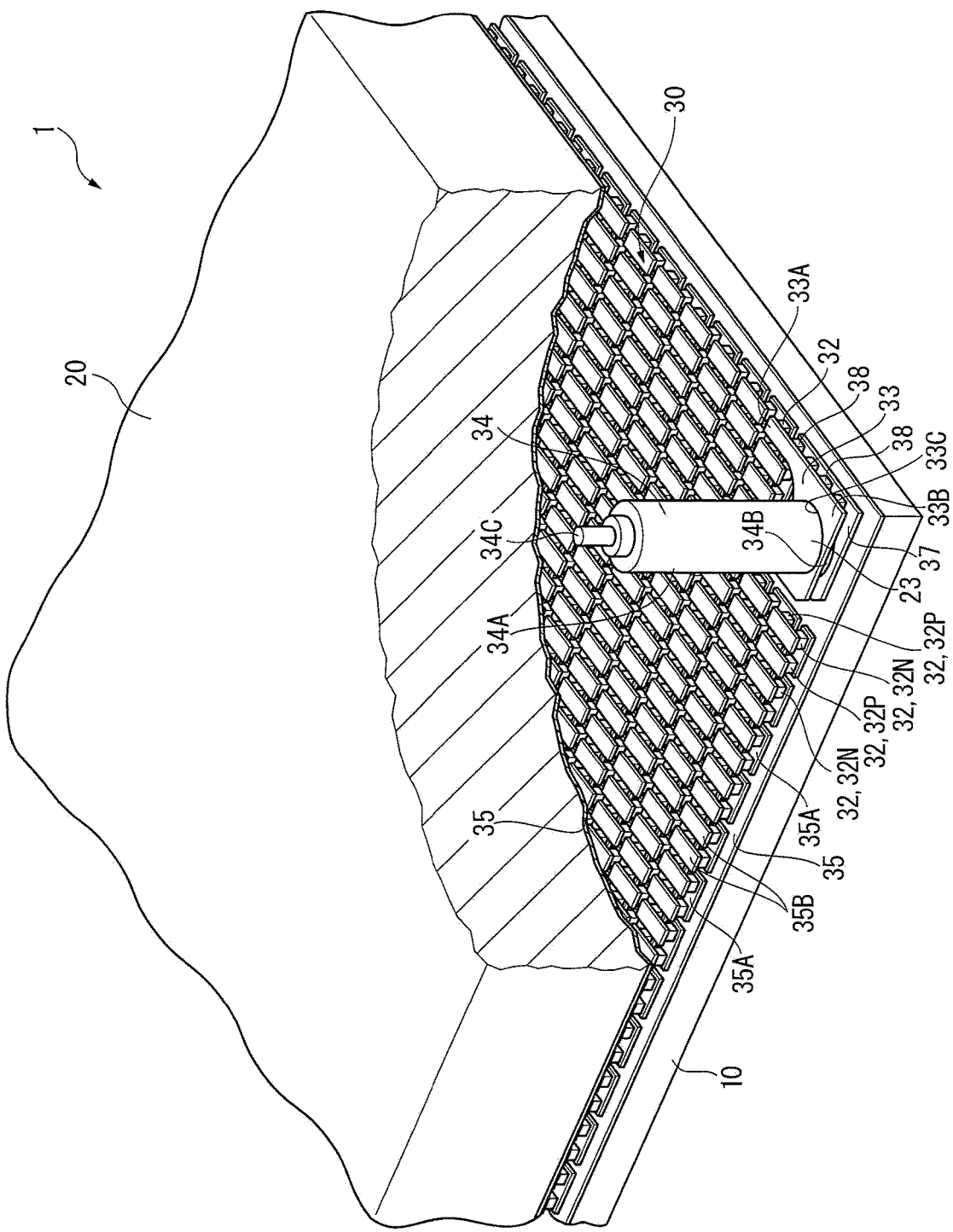
FIG. 2 is a perspective cross-sectional view of a relevant portion of the thermoelectric generator.
Figure 3:
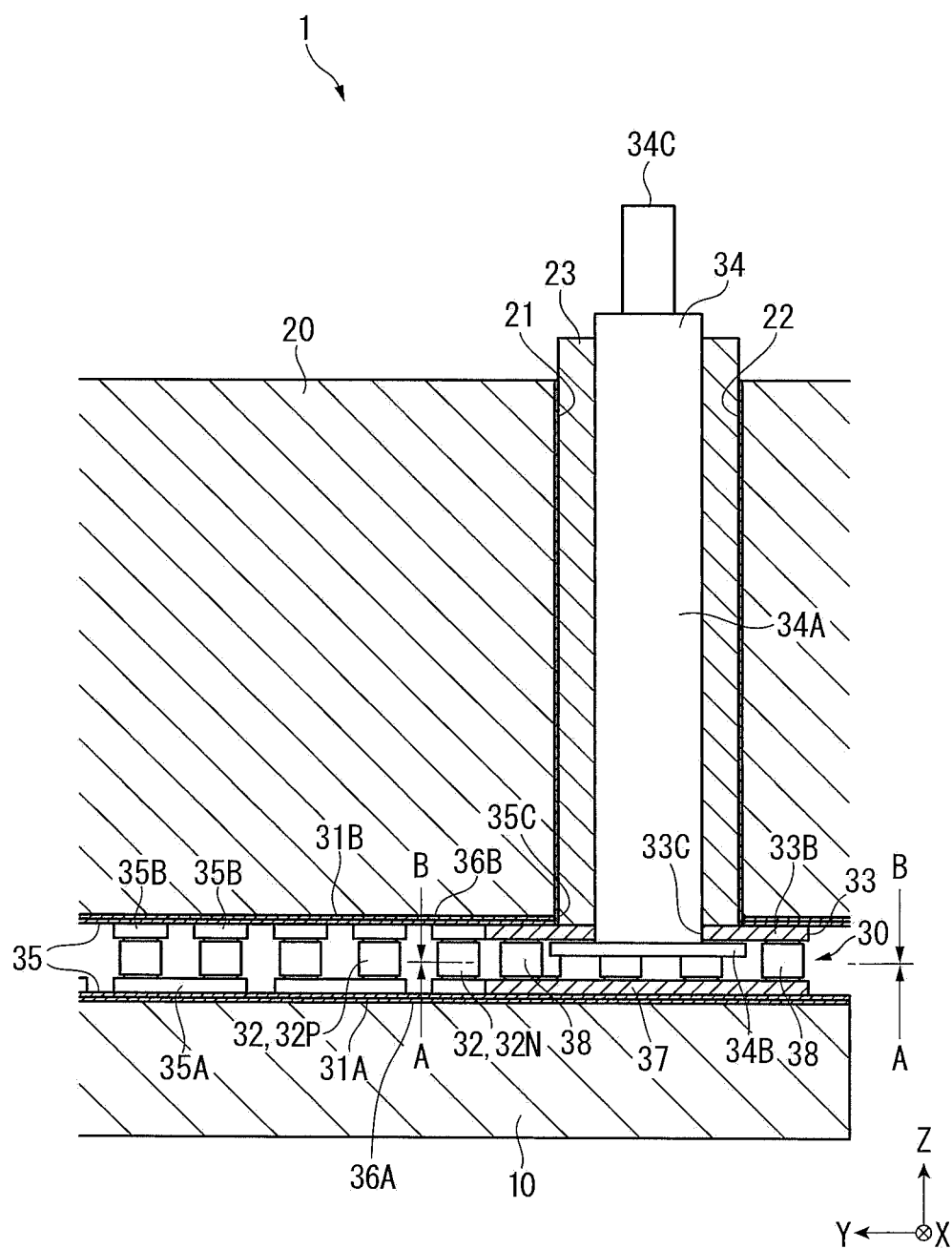
FIG. 3 is an enlarged cross-sectional view of the relevant portion of the thermoelectric generator.

FIG. 1 is a perspective view of an entire thermoelectric generator 1 according to an exemplary embodiment. FIG. 2 is a perspective cross-sectional view of a relevant portion of the thermoelectric generator 1. FIG. 3 is an enlarged cross-sectional view of the relevant portion of the thermoelectric generator.

As shown in FIGS. 1 to 3, the thermoelectric generator 1, which is formed quadrangular in a plan view, includes: a heat-receiving plate 10 configured to receive heat (shown on a lower side in the figure); a cooling plate 20 kept at a lower temperature than a temperature of the heat-receiving plate 10; and a thermoelectric generation module 30 interposed between the heat-receiving plate 10 and the cooling plate 20. For instance, when the thermoelectric generator 1 is disposed at a burning portion of a burner in a heat-treating furnace, the heat-receiving plate 10 is heated by flame of the burner and a heat energy at this time is converted into electricity.

Brief Description of Heat-Receiving Plate and Cooling Plate

The heat-receiving plate 10 is, for instance, made of iron, copper or aluminum and is heated to about 280 degrees C. by flame and the like.

The cooling plate 20 is, for instance, made of aluminum and includes a cooling circuit (not shown) in which a cooling liquid (e.g., cooling water) flows therein. The cooling plate is entirely cooled and kept at about 20 to 40 degrees C. by the cooling liquid. The cooling circuit is connected to a circulator of the cooling liquid on an outside of the cooling plate 20.

Description of Thermoelectric Generation Module

The thermoelectric generation module 30 includes: an opposed surface 31A that is opposed to the heat-receiving plate 10 and an opposed surface 31B that is opposed to the cooling plate 20; a plurality of thermoelectric elements 32 (N-type thermoelectric elements 32N, P-type thermoelectric elements 32P) interposed between the opposed surfaces 31A and 31B; a pair of terminals 33 (only one of which is shown in FIG. 2) configured to electrically conduct to the thermoelectric elements 32 positioned at both ends (at an anode and a cathode) of the plurality of thermoelectric elements 32 connected in series; lead members 34 connected to the respective terminals 33; and a pair of upper and lower thin sheets 35, which are made of polyimide and the like, respectively covering an entire side of the plurality of thermoelectric elements 32 opposed to the heat-receiving plate 10 and an entire side of the plurality of thermoelectric elements 32 opposed to the cooling plate 20 and respectively forming the opposed surfaces 31A and 31B.

Herein, in addition to integrating a plurality of thermoelectric elements 32N, 32P into a unit, the respective thin sheets 35 forming the opposed surfaces 31A and 31B are adapted to absorb a difference in thermal expansion in an in-plane direction (in an in-plane direction of a surface defined by an X-axis and a Y-axis in FIG. 3) between the heat-receiving plate 10 to be thermally expanded by receiving heat and the thermoelectric elements 32N, 32P to be thermally expanded by transferred heat. Further, the thermoelectric generation module 30 in a form of the unit is bonded to the cooling plate 20 by an insulative adhesive, whereas the thermoelectric generation module 30 is kept being pressed onto the heat-receiving plate 10 by a suitable fastener (not shown) without using an adhesive. A carbon sheet 36A, which is interposed between the heat-receiving plate 10 and the thin sheet 35 and an adhesive layer 36B (see FIG. 3) formed by the adhesive, absorb a difference in thermal expansion in a thickness direction (in a Z-axis direction in the figure) between the heat-receiving plate 10 and the thermoelectric elements 32N, 32P to be thermally expanded by transferred heat.

A plurality of heat-receiving electrodes 35A are provided on an inner surface of the thin sheet 35 near the heat-receiving plate 10. A plurality of cooling electrode 35B are provided on an inner surface of the thin sheet 35 near the cooling plate 20. In each of the N-type thermoelectric elements 32N and the P-type thermoelectric elements 32P, an end surface near the heat-receiving plate 10 is soldered to the heat-receiving electrode 35A while an end surface near the cooling plate 20 is soldered to the cooling electrode 35B. As shown in FIG. 3, the N-type thermoelectric elements 32N and the P-type thermoelectric elements 32P are electrically connected in series alternately through the heat-receiving electrode 35A and the cooling electrode 35B. Such electrodes 35A, 35B each are formed, for instance, by etching a copper foil attached to the thin sheet 35.

Figure 4A:
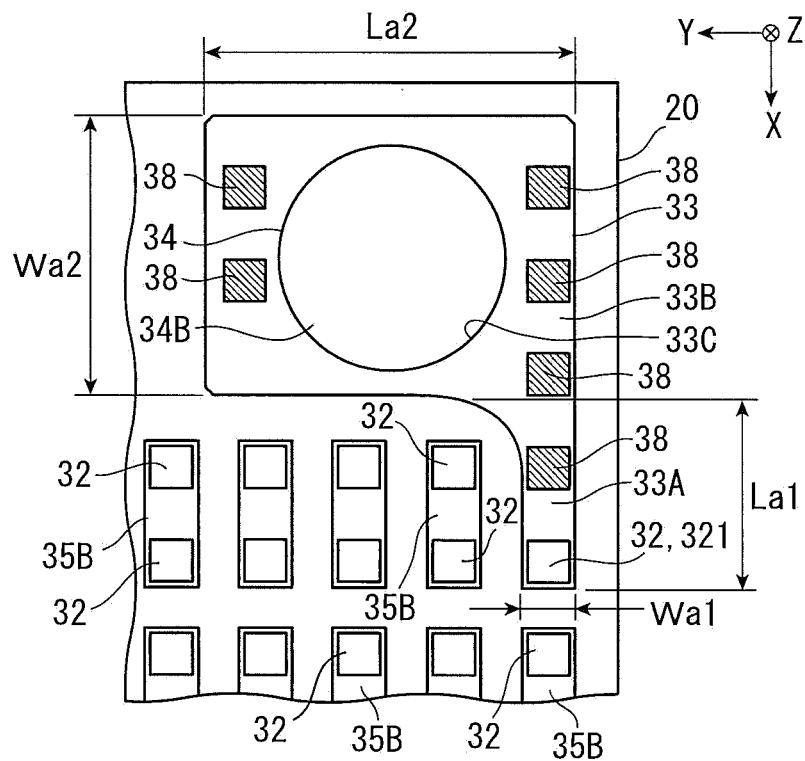
FIG. 4A shows a view seen in a direction indicated by arrows A-A in FIG. 3.

As shown in FIG. 4A, the terminals 33 having a substantially L-shape in a plan view are respectively connected to the thermoelectric elements 32 disposed at the ends among the thermoelectric elements 32 connected in series. The terminals 33 each include: an elongated element connection portion 33A connected to the thermoelectric element 32, 321 provided at the end; and a wide lead connection portion 33B integrated with the element connection portion 33A and connected to the lead member 34. Such terminals 3 each are also formed, for instance, by etching a copper foil attached to the thin sheet 35.

Description of Support Structure of Terminal

A support terminal 37 forming a part of a support structure of each of the terminals 33 and configured to support each of the terminal 33 is provided at a position opposed to each of the terminal 33 on a lower side of FIGS. 2 and 3. In the exemplary embodiment, an entire shape of the support terminal 37, which is a substantially L-shape in a plan view, is obtained by shortening a length of the element connection portion 33A of each of the terminals 33.

Figure 4B:
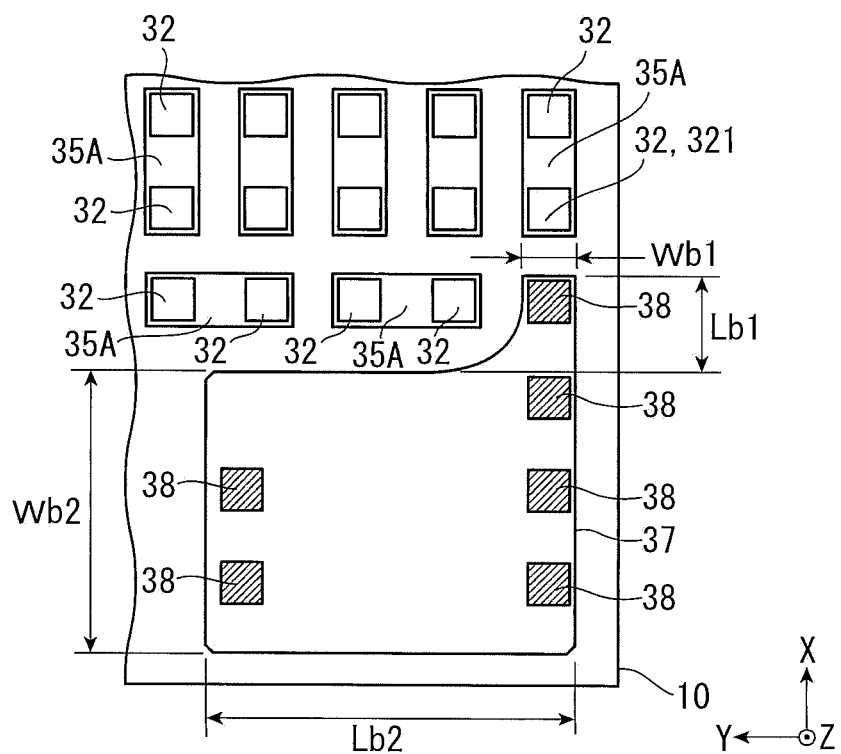
FIG. 4B shows a view seen in a direction indicated by arrows B-B in FIG. 3.

FIGS. 4A and 4B show specific shapes of the terminal 33 and support terminal 37 As shown in FIG. 4A, the element connection portion 33A forming a part of the L-shaped terminal 33 has a length La1 in the X-axis direction along one of edges that define a right angle of the cooling plate 20 and a width Wa1 in the Y-axis direction slightly larger than a width of each of the thermoelectric elements 32.

The lead connection portion 33B forming the rest of the terminal 33 has a length La2 in the Y-axis direction along the other of the edges of the cooling plate 20 and a width Wa2 in X-axis direction. Herein, the length La2 of the lead connection portion 33B is twice or more as long as the width Wa1 in a width direction of the element connection portion 33A in parallel to a length direction of the lead connection portion 33B (in the same direction as the Y-axis direction). In the exemplary embodiment, the length La2 is about seven times as long as the width Wa1. A width Wa2 of the lead connection portion 33B is twice or more as long as the width Wa1 of the element connection portion 33A. In the exemplary embodiment, the width Wa2 is about five times as long as the width Wa1.

The terminal 33 is provided in a substantially L-shape in a plan view since a length direction of the element connection portion 33A having the length La1 is orthogonal to a length direction of the lead connection portion 33B having the length La2. The same explanation applies to the support terminal 37.

As shown in FIG. 4B, a portion of the support terminal 37 corresponding to the element connection portion 33A of the terminal 33 has a length Lb1 shorter than the length La1 and a width Wb1 equal to the width Wa1. A portion of the support terminal 37 corresponding to the lead connection portion 33B of the terminal 33 has a length Lb2 equal to the length La2 and a width Wb2 equal to the width Wa2.

A method of forming the support terminal 37 is the same as those of forming the terminal 33 and the electrodes 35A and 35B.

Since no thermoelectric element 32 is connected to the support terminal 37, a portion corresponding to a tip end of the elongated portion of the element connection portion 33A of the terminal 33 is neither present nor required in the support terminal 37 while a portion corresponding to the lead connection portion 33B of the terminal 33 is present in the support terminal 37. Accordingly, an entire shape of the support terminal 37 may be a rectangular shape provided only by the portion corresponding to the lead connection portion 33B of the terminal 33.

In the exemplary embodiment in which the lead members 34 are provided at the anode and the cathode, a pair of terminals 33 and a pair of support terminals 37 are also provided. The pair of terminals 33 (not shown) are axisymmetric to each other in a plan view. The support terminals 37 are also axisymmetric to each other in a plan view. Specifically, the terminals 33 and the support terminals 37 are axisymmetric with respect to a line traversing the middle of a pair of lead members 34, namely, a line I-I bisecting the thermoelectric generator 1 (see FIG. 1).

A plurality of support elements 38 to support the terminal 33 as a support member are interposed between the terminal 33 and the support terminal 37 in a manner to circumvent a bonding portion of the lead member 34 with the terminal 33.

An outline of each of the support elements 38 is the same as that of each of the thermoelectric elements 32. In FIGS. 4A and 4B, in order to easily differentiate the thermoelectric elements 32 from the support elements 38, the thermoelectric elements 32 are not shown in hatched lines while only the support elements 38 are shown in hatched lines.

The lead connection portion 33B of the terminal 33 is bonded with two support elements 38 in the X-axis direction on the left side of the lead member 34 in the figure while being bonded with three support elements 38 in the X-axis direction on the right side of the lead member 34 in the figure. Thus, the plurality of support elements 38 are disposed to the terminal 33 in a manner to surround the bonding portion of the lead member 34 with the terminal 33. Each of the lead members 34 is substantially cylindrical and heavy in weight. Accordingly, in order to avoid each of the terminals 33 from being bent by being connected to each of the lead member 34, the support elements 38 support the surroundings of the bonding portion of the lead member 34. It should be noted that another support member may be interposed between a lower surface (shown in the figure) of the lead member 34 and the support terminal 37 under the lead member 34 to directly support the lead member 34.

Description of Lead Member and Surrounding Structure

As shown in FIG. 3, the lead member 34, which is made of electrically conductive metal such as copper, includes: a cylindrical body 34A; a welded portion 34B shaped in a flange provided at a lower end of the body 34A; and a wire connection portion 34C having a smaller diameter and projecting from an upper end of the body 34A. An upper side of the lead member 34 from the body 34A is inserted from below through a through hole 33C provided on the terminal 33 and a through hole 35C provided on the thin sheet 35 over the terminal 33. An upper surface of the welded portion 34B shaped in a flange of the lead member 34 is continuously soldered in a circumferential direction to a lower surface of the terminal 33.

By this soldering, a gap between the through hole 33C of the terminal 33 and the welded portion 34B of the lead member 34 is sealed, so that moisture is prevented from entering the thermoelectric generation module 30. Although not shown in the figure, since an annular seal member is interposed or a filler is fed between the heat-receiving plate 10 and the cooling plate 20, an outer circumference of the thermoelectric generation module 30 is sealed from an outside.

The soldered lead member 34 standing on the terminal 33 penetrates the through hole 35C of the thin sheet 35 forming the opposed surface 31B to extend in a direction (in a Z-axial arrow direction in FIG. 3) orthogonal to an in-plane direction of the thin sheet 35, in other words, vertically from a part of the lead member 34 bonded to the terminal 33 toward the cooling plate 20. The cooling plate 20 has a vertically penetrating through hole 21. An upper end of the lead member 34 is drawn through the through hole 21 to the outside of the cooling plate 20. Accordingly, there is no possibility that the lead member 34 contacts with the heat-receiving plate 10. A lead wire (not shown) is connected by soldering and the like to an upper end of the wire connection portion 34C of the lead member 34 exposed from the cooling plate 20 and is further drawn out to a desired position.

On the other hand, an insulation film 22 is formed by applying an insulative coating on an inner surface of the through hole 21 of the cooling plate 20 in which the lead member 34 is inserted. Further, in the exemplary embodiment, a gap between the lead member 34 and the through hole 21 is filled with an insulation material 23. With the insulation film 22 and the insulation material 23, insulation durability is ensured between the cooling plate 20 and the lead member 34.

However, depending on a size of the gap between the through hole 21 and the lead member 34, the gap is sometimes enough to ensure a sufficient insulation durability. In such a case, the insulation film 22 and the insulation material 23 may be omitted. In the bonding portion of the lead member 34 shown in FIG. 3, the insulation film 22 and the insulation material 23 are provided inside the through hole 35C of the thin sheet 35 while lower ends of the respective insulation film 22 and insulation material 23 reach an upper surface of the terminal 33. However, a specific structure of such a bonding portion is not limited to the structure shown in FIG. 3 as long as moisture and the like are unlikely to enter the thermoelectric generation module 30.

Advantage(s) of Embodiment(s)

According to the exemplary embodiment described above, the lead member 34 bonded to the terminal 33 of the thermoelectric generation module 30 extends from the terminal 33, penetrating the opposed surface 31B that is opposed to the cooling plate 20, and reaching the cooling plate 20 (i.e., in the Z-axial arrow direction in FIG. 3) in the thermoelectric generator 1. Accordingly, there is no possibility that the lead member 34 contacts with the heat-receiving plate 10 to be heated to a high temperature, so that the lead member 34 can be reliably prevented from deterioration and the like due to heat.

Modification(s)

The scope of the invention is not limited to the above exemplary embodiment, but includes modifications and improvements as long as an object of the invention can be achieved.

For instance, although the metallic cylindrical lead member 34 is used as the lead member in the above exemplary embodiment, a lead member 39 having a lead wire 39A may be used as shown in first to fourth modifications in FIGS. 5A to 5D. Herein, the lead wire 39A refers to a cable or the like in a form of a metallic lead wire covered with a resin-made coating material.

Figure 5A:
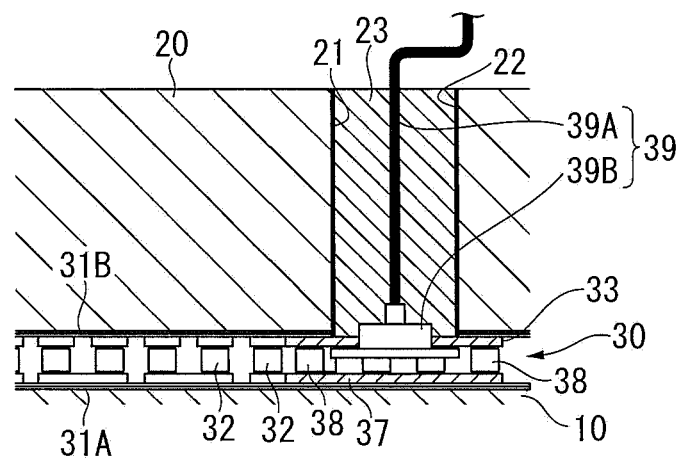
FIG. 5A is a cross-sectional view of a first modification of the invention.

Specifically, in the first modification shown in FIG. 5A, the lead member 39 includes: the lead wire 39A in a form of a suitable cable; and a metallic welding material 39B having a smaller vertical dimension than the lead member 34. The lead wire 39A is connected to the welding material 39B welded to the terminal 33 at a position where the welding material 39B penetrates the terminal 33 and the opposed surface 31B formed by the thin sheet 35 toward the cooling plate 20. The lead wire 39A is drawn to the outside through the through hole 21 of the cooling plate 20. Further, in the first modification, the insulation film 22 is formed inside the through hole 21 and the insulation material 23 is fed in the through hole 21 in the same manner as in the above exemplary embodiment.

Figure 5B:
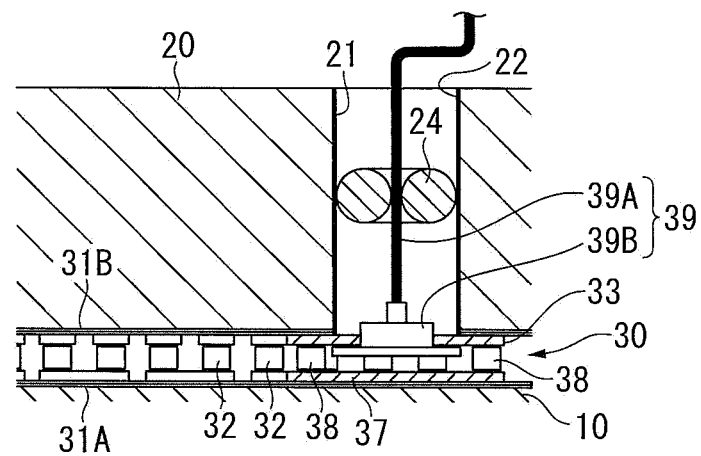
FIG. 5B is a cross-sectional view of a second modification of the invention.

In the second modification shown in FIG. 5B, an elastic annular grommet 24 made of a heat-resistant resin and the like is used in place of the insulation material 23 to be fed in the through hole 21. The grommet 24 is fitted substantially at a middle position in the vertical direction (penetrating direction) in the through hole 21. Since the lead wire 39A is held at the center of the grommet 24, the lead wire 39A is prevented from contacting with the cooling plate 20 and moisture is prevented from entering the thermoelectric generation module 30 from the through hole 21.

Figure 5C:
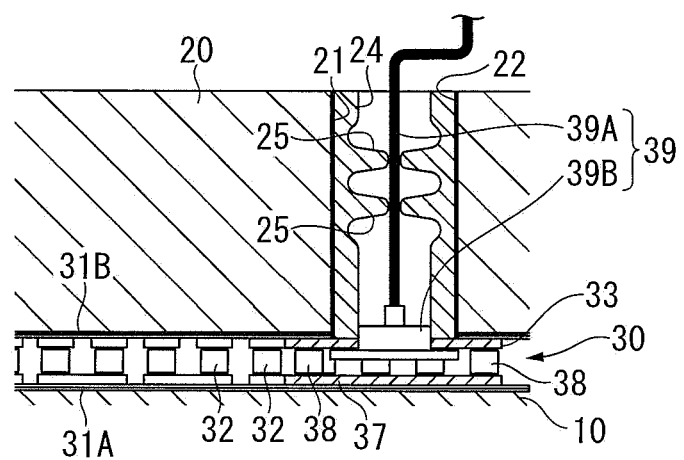
FIG. 5C is a cross-sectional view of a third modification of the invention.

The grommet 24 used in the third modification shown in FIG. 5C is a cylindrical member to be housed in the through hole 21 and includes a plurality of holding portions 25 that hold the inserted lead wire 39A therein.

Figure 5D:
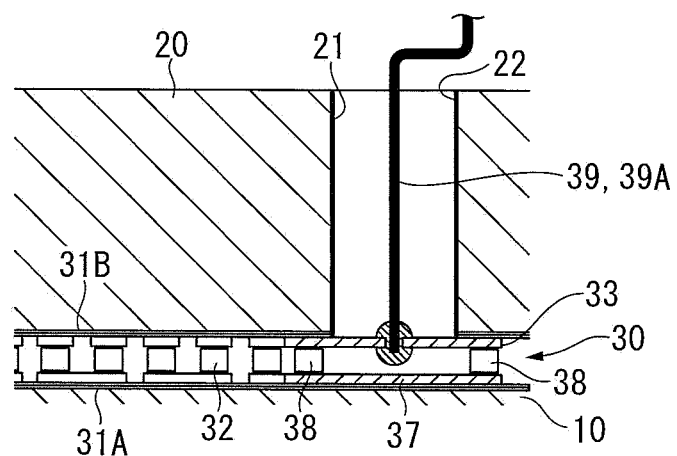
FIG. 5D is a cross-sectional view of a fourth modification of the invention.

In the fourth modification shown in FIG. 5D, the lead member 39 only includes the lead wire 39A without the welding material 39B. Such a lead wire 39A is directly soldered to the lower surface of the terminal 33, penetrates the terminal 33 and the opposed surface 31B formed by the thin sheet 35, and is drawn toward the cooling plate 20 through the through hole 21 to reach the outside of the cooling plate 20. In the fourth modification, the insulation material 23 may be fed, or the grommet 24 in any shape may be used. The insulation film 22 and the like may be formed as needed or omitted. The same applies to the first to third modifications.

In the above exemplary embodiment, since the lead member 34 is in a form of a column, the lead member 34 is drawn from the bonding portion with the terminal 33 straight toward the cooling plate 20 (in the direction orthogonal to the opposed surface 31B and in the Z-axial arrow direction in FIG. 3). However, as long as being positioned within the thermoelectric generation module 30, for instance, the lead member 34 may proceed in the in-plane direction between the pair of thin sheets 35 for a while (in a direction in parallel to the opposed surface 31B and in an in-plane direction of a plane defined by the X axis and the Y axis in FIG. 3) and subsequently may penetrate the opposed surface 31B and be drawn out to the cooling plate 20. Even with this arrangement, since the lead member 34 is not drawn into a space between the heat-receiving plate 10 and the cooling plate 20, the advantages of the invention can also be obtained. Thus, the invention encompasses this arrangement.

In addition, the respective specific shapes of the terminal 33 and the support terminal 37 are not limited to the shapes described in the above arrangement. Any suitable shape may be used for implementing the invention.

The invention claimed is:

1. A thermoelectric generator comprising:
a heat-receiving plate configured to receive heat;
a cooling plate configured to be kept at a lower temperature than a temperature of the heat-receiving plate; and
a thermoelectric generation module interposed between the heat-receiving plate and the cooling plate, wherein
the thermoelectric generation module comprises: an opposed surface that is opposite the cooling plate; a plurality of heat-receiving electrodes and a plurality of cooling electrodes that are provided between the heat-receiving plate and the cooling plate, the plurality of heat-receiving electrodes being provided opposite the plurality of cooling electrodes; a plurality of thermoelectric elements that are electrically connected to each other through the heat-receiving electrodes and the cooling electrodes; a terminal configured to electrically conduct to the thermoelectric elements; a lead member bonded to the terminal; and a first thin sheet that covers an entire side of the plurality of thermoelectric elements opposite the cooling plate and that forms the opposed surface,
the terminal is provided at a surface of the first thin sheet opposite the thermoelectric elements, the terminal is directly bonded to (i) a plurality of support members that support the terminal and (ii) one of the plurality of thermoelectric elements that is directly bonded to one of the heat-receiving electrodes or one of the cooling electrodes, the plurality of support members surrounding a bonding portion of the terminal bonded to the lead member, the lead member penetrates the first thin sheet to extend to the cooling plate and is soldered to the terminal, the thermoelectric generation module further comprises:
a second thin sheet covering an entire side of the plurality of thermoelectric elements opposite the heat-receiving plate, and
a support terminal provided on a surface of the second thin sheet facing the terminal, each of the plurality of support members is bonded between the terminal and the support terminal, and none of the plurality of thermoelectric elements directly contacts the support terminal.

2. The thermoelectric generator according to claim 1, wherein each support member has the same outline as the thermoelectric element.

3. The thermoelectric generator according to claim 1, wherein
the terminal comprises an element connection portion connected to the thermoelectric elements, and
the support terminal has a portion having substantially the same shape as the element connection portion in a plan view.

4. The thermoelectric generator according to claim 1, wherein
the terminal comprises: an element connection portion having a predetermined length and connected to the thermoelectric elements; and a lead connection portion having a predetermined length and connected to the lead member, wherein
the element connection portion and the lead connection portion form substantially an L-shape in a plan view such that a length direction of the element connection portion is orthogonal to a length direction of the lead connection portion.

5. The thermoelectric generator according to claim 4, wherein
a length of the lead connection portion of the terminal is twice or more as long as a width in a width direction of the element connection portion in parallel to the length direction of the lead connection portion.

6. The thermoelectric generator according to claim 1, wherein
the lead member and the terminal are provided at each of ends at an anode and a cathode in an electric circuit of the plurality of thermoelectric elements connected in series, and
the terminals at the respective ends are axisymmetric to each other in a plan view.

7. The thermoelectric generator according to claim 1, wherein
the lead member is drawn out to an outside through a through hole provided on the cooling plate.

8. The thermoelectric generator according to claim 7, wherein an insulation film is provided at an inner surface of the through hole.

9. The thermoelectric generator according to claim 7, wherein an insulation material is fed between the through hole and the lead member.

10. The thermoelectric generator according to claim 1, wherein the lead member is made of metal and shaped in a column.

11. The thermoelectric generator according to claim 1, wherein the lead member comprises a lead wire covered with an insulation material.

12. The thermoelectric generator according to claim 1, wherein the plurality of thermoelectric elements comprises N-type thermoelectric elements and P-type thermoelectric elements that are electrically connected in series alternately through the heat-receiving electrodes and the cooling electrodes.

13. The thermoelectric generator according to claim 1, wherein all of the plurality of thermoelectric elements are disposed outside of the support terminal such that none of the plurality of thermoelectric elements directly contacts the support terminal.

14. The thermoelectric generator according to claim 1, wherein
the terminal comprises an element connection portion that contacts at least one of the plurality of support members and at least one of the plurality of thermoelectric elements, the element connection portion extending from a side of the terminal to the at least one of the plurality of thermoelectric elements by a first length, and
the support terminal has an end portion that is spaced apart from the element connection portion and that faces the element connection portion, the end portion extending from a side of the support terminal to the at least one of the plurality of support members by a second length shorter than the first length.

15. A thermoelectric generator comprising:
a heat-receiving plate configured to receive heat;
a cooling plate configured to be kept at a lower temperature than a temperature of the heat-receiving plate; and
a thermoelectric generation module interposed between the heat-receiving plate and the cooling plate, wherein
the thermoelectric generation module comprises: an opposed surface that is opposite the cooling plate; a plurality of heat-receiving electrodes and a plurality of cooling electrodes that are provided between the heat-receiving plate and the cooling plate, the plurality of heat-receiving electrodes being provided opposite the plurality of cooling electrodes; a plurality of thermoelectric elements that are electrically connected to each other through the heat-receiving electrodes and the cooling electrodes; a terminal configured to electrically conduct to the thermoelectric elements; a lead member bonded to the terminal; and a first thin sheet that covers an entire side of the plurality of thermoelectric elements opposite the cooling plate and that forms the opposed surface,
the terminal is provided at a surface of the first thin sheet opposite the thermoelectric elements,
the terminal is directly bonded to a support member that supports the terminal,
the lead member penetrates the first thin sheet to extend to the cooling plate and is soldered to the terminal,
the lead member comprises: a body that penetrates the first thin sheet to extend to the cooling plate; and a flange portion that is provided at an end of the body and that is bonded to the terminal in a circumferential direction of the body, the thermoelectric generation module further comprises:
- a second thin sheet covering an entire side of the plurality of thermoelectric elements opposite the heat-receiving plate, and
- a support terminal provided on a surface of the second thin sheet facing the terminal, and none of the plurality of thermoelectric elements directly contacts the support terminal.

16. The thermoelectric generator of claim 15, wherein the support member comprises a plurality of support members that support the terminal, the plurality of support members surrounding a bonding portion of the terminal bonded to the lead member.

17. The thermoelectric generator of claim 16, wherein each of the plurality of support members is bonded between the terminal and the support terminal.

18. The thermoelectric generator of claim 15, wherein the flange portion is soldered to the terminal in the circumferential direction of the body.

19. The thermoelectric generator according to claim 15, wherein the plurality of thermoelectric elements comprises N-type thermoelectric elements and P-type thermoelectric elements that are electrically connected in series alternately through the heat-receiving electrodes and the cooling electrodes.

* * * * *